US009771258B2

(12) United States Patent
Diep et al.

(10) Patent No.: US 9,771,258 B2
(45) Date of Patent: Sep. 26, 2017

(54) WAFER LEVEL MEMS PACKAGE INCLUDING DUAL SEAL RING

(71) Applicant: Raytheon Company, Waltham, MA (US)

(72) Inventors: Buu Q. Diep, Murphy, TX (US); Adam M. Kennedy, Santa Barbara, CA (US); Thomas Allan Kocian, Dallas, TX (US); Mark Lamb, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/748,482

(22) Filed: Jun. 24, 2015

(65) Prior Publication Data

US 2016/0376146 A1 Dec. 29, 2016

(51) Int. Cl.
*H01L 23/498* (2006.01)
*B81C 1/00* (2006.01)
*B81B 7/00* (2006.01)

(52) U.S. Cl.
CPC ........ *B81C 1/00317* (2013.01); *B81B 7/0041* (2013.01); *B81B 7/0058* (2013.01); *B81C 1/00269* (2013.01); *B81B 2201/0207* (2013.01); *B81B 2201/04* (2013.01); *B81C 2203/019* (2013.01); *B81C 2203/0109* (2013.01); *B81C 2203/0118* (2013.01); *B81C 2203/0145* (2013.01)

(58) Field of Classification Search
CPC ......... H01L 23/49866; H01L 21/76841; H01L 27/14636
See application file for complete search history.

(56) References Cited

U.S. PATENT DOCUMENTS

| 9,093,444 B2* | 7/2015 | Gooch ............ H01L 23/49866 |
| 2006/0030074 A1 | 2/2006 | Mund |
| 2007/0035001 A1* | 2/2007 | Kuhmann ............ B81C 1/0023 257/680 |
| 2012/0096813 A1 | 4/2012 | Gooch |
| 2015/0014854 A1 | 1/2015 | Gooch et al. |

FOREIGN PATENT DOCUMENTS

WO 2015004166 A1 1/2015

OTHER PUBLICATIONS

International Search Report and Written Opinion for Application No. PCT/US2016/028338; filed Apr. 20, 2016, dated Jul. 1, 2016, pp. 1-10.

* cited by examiner

*Primary Examiner* — Mark Prenty
(74) *Attorney, Agent, or Firm* — Cantor Colburn LLP

(57) ABSTRACT

A microelectromechanical systems (MEMS) package includes a substrate extending between a first pair of outer edges to define a length and a second pair of outer edges to define a width. A seal ring assembly is disposed on the substrate and includes at least one seal ring creating a first boundary point adjacent to at least one MEMS device and a second boundary point adjacent at least one of the outer edges. The package further includes a window lid on the seal ring assembly to define a seal gap containing the at least one MEMS device. The seal ring assembly anchors the window lid to the substrate at the second boundary point such that deflection of the window lid into the seal gap is reduced.

4 Claims, 9 Drawing Sheets

Cavity Size vs. Actual Deflection

| | PACKAGE 1 | PACKAGE 2 | PACKAGE 3 |
|---|---|---|---|
| W x L (mm) | 3.9 x 4.6 | 13.9 x 17.6 | 15.7 x 17.1 |
| Cavity (mm$^2$) | 7.0 | 57.1 | 107.8 |
| Deflection (um) | 0.29um | 2.4um | 4.0um |

| CONFIGURATION | CAVITY AREA (mm^2) | PRO/MECHANICA WILDFIRE V. 4.0 MODEL | | | | | | | |
|---|---|---|---|---|---|---|---|---|---|
| | | ROIC MAX PRIN STRESS - PRESSURE (psi) | ROIC MAX PRIN STRESS - CTE (psi) | ROIC MAX PRIN STRESS - PRESSURE & CTE (psi) | ROIC DEFLECTION (BOTTOM SIDE) (MICRONS) | LID MAX PRIN STRESS - PRESSURE (psi) | LID MAX PRIN STRESS - CTE (psi) | LID MAX PRIN STRESS - PRESSURE & CTE (psi) | LID DEFLECTION (TOP SIDE) (MICRONS) |
| SINGLE TRACK DESIGN - MEDIUM CAVITY SIZE | 67 | 3424 | 14510 | 14890 | 1.99 | 17010 | 7293 | 17970 | 1.69 |
| DUAL TRACK DESIGN - MEDIUM CAVITY SIZE | 67 | 1116 | 17650 | 17430 | 0.89 | 4264 | 6275 | 8667 | 0.87 |
| DUAL TRACK DESIGN - LARGE CAVITY SIZE-1 | 244 | 3485 | 17260 | 17120 | 8.3 | 4170 | 6095 | 8255 | 8.40 |
| DUAL TRACK DESIGN - LARGE CAVITY SIZE-2 | 212 | 1067 | 17950 | 16320 | 5.3 | 3134 | 5313 | 7387 | 7.60 |

FIG. 4

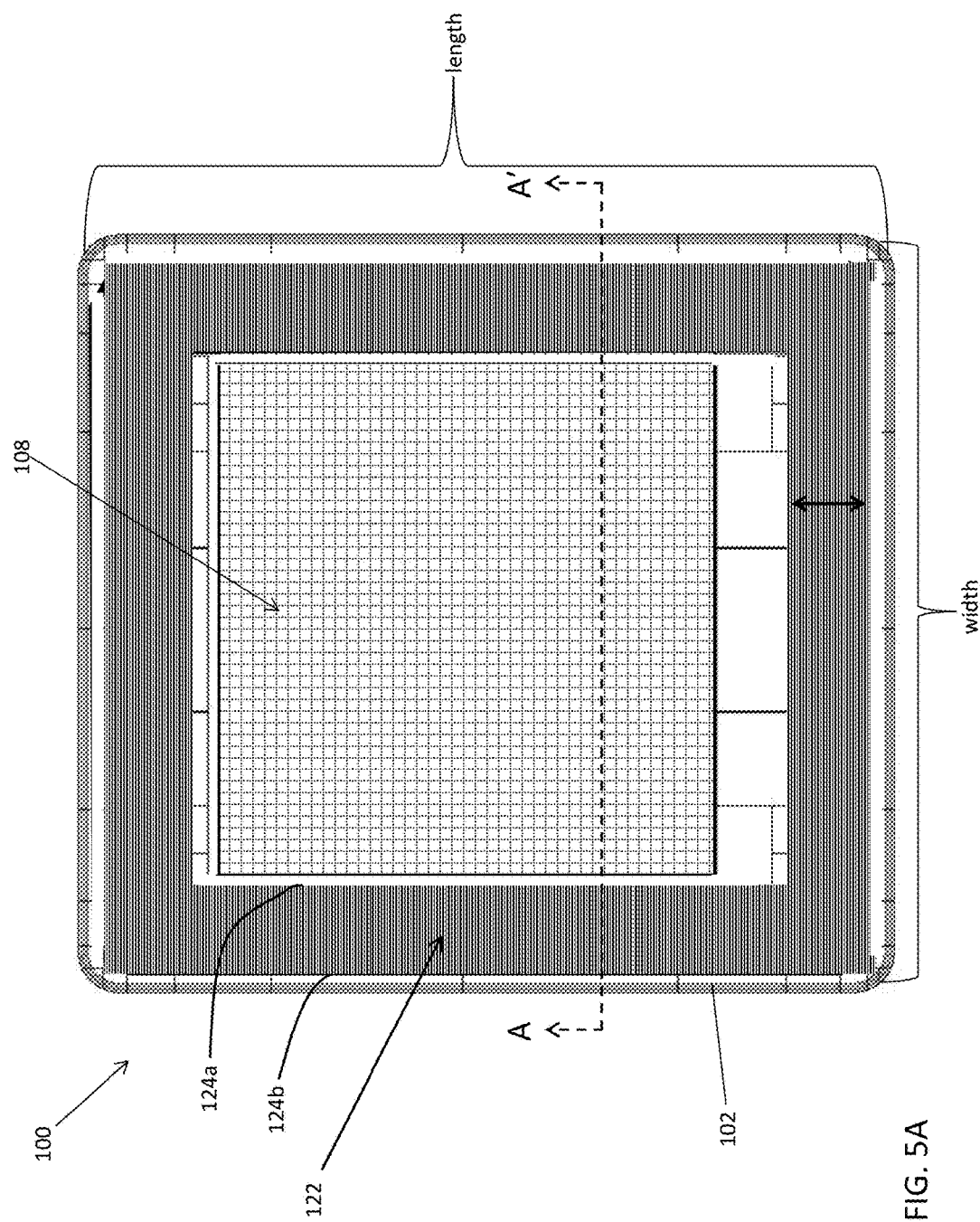

WAFER LEVEL MEMS PACKAGE INCLUDING DUAL SEAL RING

GOVERNMENT LICENSE RIGHTS

This invention was made with Government support under HR0011-11-C-0125 awarded by the Government. The Government has certain rights in the invention.

BACKGROUND

The present disclosure relates to microelectromechanical systems (MEMS), and more particularly, to microbolometer package design.

Microelectromechanical systems (MEMS) are made up of one or more very small scale electrical components. For example, MEMS devices included in a MEMS can range in size from, for example, approximately 20 micrometers (μm) to approximately 1 millimeter (mm). Microbolometers are a type of MEMS device that include a thermal sensitive material having a temperature-dependent electrical resistance. One feature of microbolometers is the capability of measuring the power of incident electromagnetic radiation in response to receiving thermal or radiation energy. In essence, the microbolometer behaves as an image pixel, where the output intensity of the pixel is based on the amount thermal/radiation energy received. Accordingly, microbolometers are widely used in various energy sensing devices, such as infrared (IR) sensors, thermal imaging cameras, and night vision cameras, for example, to generate an image in response to thermal/radiation energy stimulation.

One design characteristic of microbolometers is the requirement of a high vacuum environment that thermally isolates the microbolometers from the external ambient temperatures, i.e., external thermal energy. Referring to FIG. 1, for example, a MEMS package 5 includes a microbolometer package 10. Microbolometer packages 10 typically include a vacuum region 15 created by sealing a wafer level package (WLP) 20 to a window cap wafer 25 (i.e., window lid 25) via a single narrow ring seal 30. The WLP 20 includes one or more reference pixels (RPs) 35 disposed thereon. Thus, the vacuum region 15 defines a clearance (d) between the RPs 35 and the window lid 25. However, the vacuum within the vacuum region 15 creates a pressure differential with respect to the exterior atmospheric pressure that causes the window lid 25 to deform/deflect toward the WLP 20 and into the vacuum region 15.

Conventional microbolometer packages 10 use only the single narrow seal ring 30 formed on a metal under-layer (U/L) between the WLP 20 and the window lid 25 to reduce stress and deflection of the window lid 25. For a 1D case we can treat this as a simple beam to understand how the deflection and stress at the joint are a strong function of the distance between the solder joints (span). The deflection in the window can be associated by the following formula:

$$Y_{max} = -\frac{w_a l^4}{384EI} \text{ at } X = L/2, \text{ where} \quad (1)$$

Wa is force per unit length for the 1D case,
E is the young's modulus and is a material property of the window, and
I is the area moment of inertia, which can be further described as:

$$I = \frac{bh^3}{12}$$

where h is the thickness of the window.

From equation 1, it can be appreciated that the deflection increases with the span (length) to the fourth power so that a small increase in span causes a much large increase in deflection. The bending moment on the joint is cause by the force that is exerted on the window. This scales directly with the area of the window. For the 1D case it scales directly with the span. Further, the pressure is defined as P=F/A, where "F" is force and "A" is area, and the pressure for is fixed at 1 atmosphere. However, the area "A" will change with the increase in the span. Thus, as the area "A" changes so does force "F". Since there is a vacuum at vacuum region 15, the larger the span, the larger the force (F). The larger the force (F) that is creating the moment, the greater the stress also at the joint.

Referring to FIGS. 2A-2B, experimental results further illustrate that the pressure differential increases as the size of vacuum region 15 is increases, thereby increasing the deflection of the window lid 25. If the vacuum region 15 is formed too large, the window lid 25 is allowed to pivot about the seal ring 30 and can contact and/or crush the RPs 35 (see FIG. 1). One conventional solution to counteract the increase in deflection is to increase the thickness of the window lid 25. However, incident electromagnetic radiation is inhibited from reaching the WLP 20 as the window lid 25 thickness is increased. Consequently, conventional microbolometer package designs are limited to the size of the cavity region and the thickness of the window lid, which ultimately limits the overall thermal sensitivity and image quality of the imaging device.

SUMMARY

According to one embodiment, a microelectromechanical systems (MEMS) package includes a substrate extending between a first pair of outer edges to define a length and a second pair of outer edges to define a width. A seal ring assembly is disposed on the substrate and includes at least one seal ring creating a first boundary point adjacent to at least one MEMS device and a second boundary point adjacent at least one of the outer edges. The package further includes a window lid on the seal ring assembly to define a seal gap containing the at least one MEMS device. The seal ring assembly anchors the window lid to the substrate at the second boundary point such that deflection of the window lid into the seal gap is reduced.

According to another embodiment, a method of reducing deflection of a window lid included in a MEMS package comprises forming a seal ring assembly including at least one seal ring on an upper surface of a substrate to create a first boundary point adjacent at least one MEMS device formed on the upper surface, and a second boundary point adjacent at least one of outer edge of the substrate. The method further includes forming a window lid on the seal ring assembly to define a seal gap containing the at least one MEMS device. The method further includes anchoring the window lid to the substrate via at least the second boundary point such that the deflection of the window lid into the seal gap is reduced.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIG. 4 is a table summarizing analysis results of various microbolometer package designs including a dual seal ring assembly compared to conventional package designs including a single narrow seal ring;

FIGS. 5A-5B illustrate a microbolometer package including a wide seal ring assembly according to another non-limiting embodiment.

DETAILED DESCRIPTION

Various non-limiting embodiments of the disclosure provide a MEMS package such as, for example a microbolometer package, including a dual seal ring assembly that reduces window lid deformation and deflection compared to conventional microbolometer packages having only a single narrow seal ring. According to an embodiment, the dual seal ring assembly includes an inner seal ring disposed at a close vicinity to one or more MEMS devices such as a video reference pixel (VRP) group, for example, and an outer seal ring disposed at a close vicinity to one or more edges edge of the MEMS package. The arrangement of the inner seal ring and outer seal ring prevents the window lid from pivoting about the inner seal ring, thereby reducing the deflection of the window lid. In this manner, a cavity region of the MEMS package can be increased such that a larger pixel array (i.e., a greater number of pixels) can be implemented in the MEMS package. Moreover, the thickness of the window lid can be reduced, thereby improving the thermal sensitivity of the MEMS package. Accordingly, an imaging device implementing the MEMS package designed according to at least one embodiment of the inventive teachings realizes improved image quality.

Figure 1:
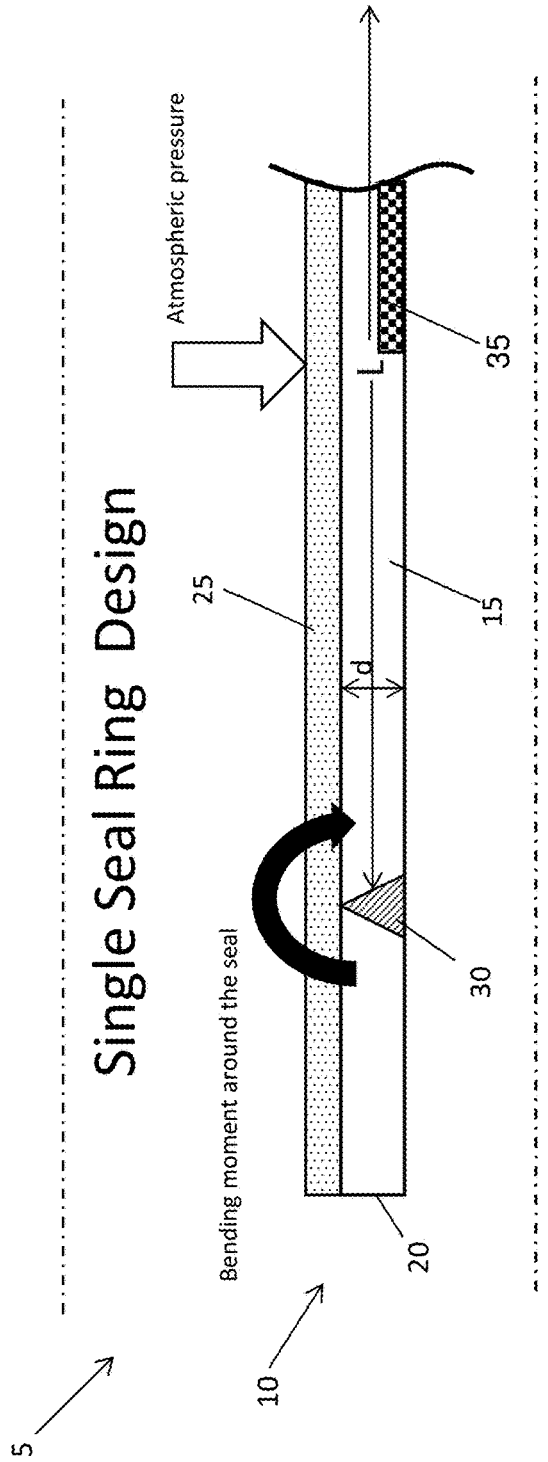
FIG. 1 is a cross-sectional view of a conventional microbolometer package including a single narrow seal ring and a window lid capable of pivoting about the seal ring in response to atmospheric pressure.
Figures 2A, 2B:
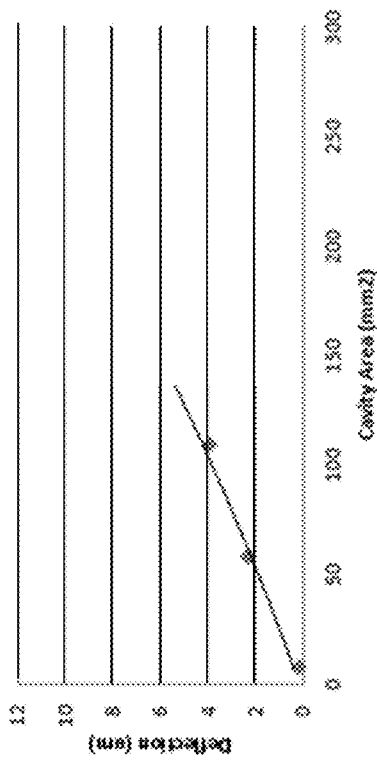
FIG. 2A is a line graph illustrating window deflection of a conventional microbolometer package versus cavity size of the microbolometer package.
FIG. 2B is table illustrating the data shown in the line graph of FIG. 2A.
Figure 3A:
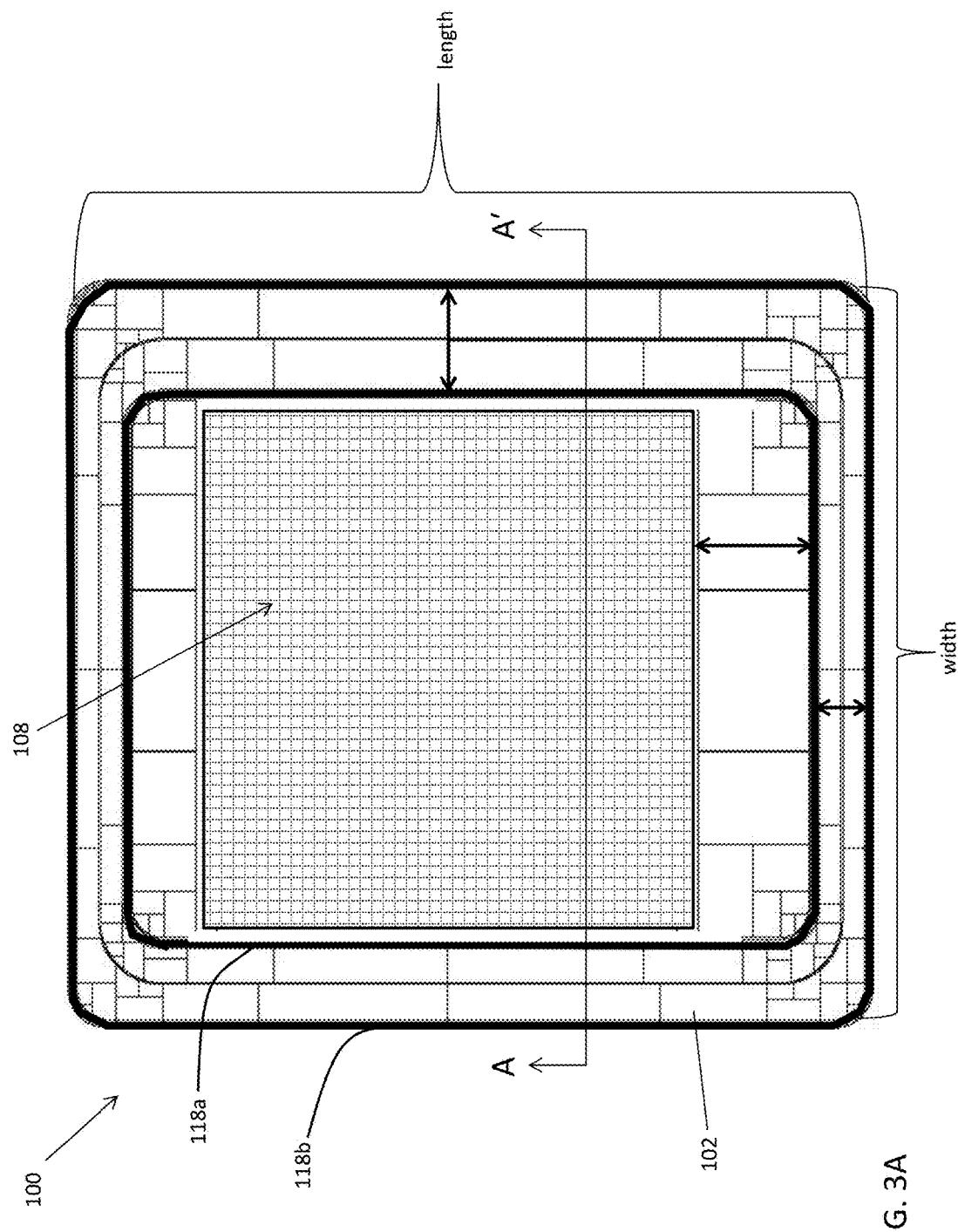
FIG. 3A is a top view of a microbolometer package including a dual seal ring assembly according to a non-limiting embodiment.
Figure 3B:
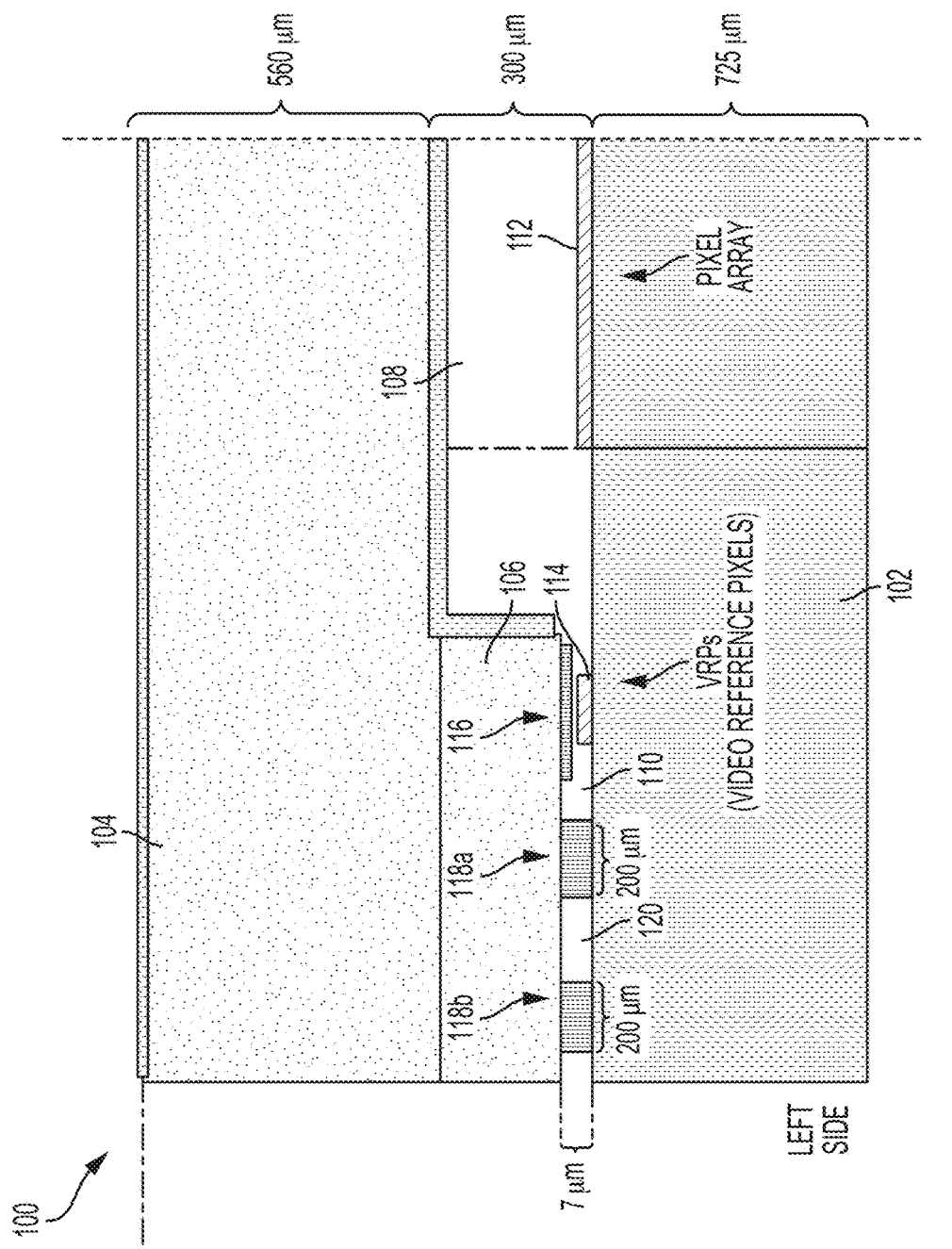
FIG. 3B is a cross-sectional view of the microbolometer package taken along line A-A' and showing the dual seal ring assembly inhibiting the window lid from deflecting into the cavity region.

With reference now to FIGS. 3A and 3B, a microelectromechanical system (MEMS) package 100 is illustrated according to a non-limiting embodiment. According to a non-limiting embodiment, the MEMS package 100 is constructed as a microbolometer package, but the invention is not limited thereto. The MEMS package 100 includes a substrate 102 and a window lid 104. The substrate 102 extends along a first axis to define a substrate length, a second axis to define a substrate width, and a third axis to define a substrate height. The substrate 102 can be formed from various semiconductor materials including, but not limited to, silicon (Si), and can have a typical thickness ranging from approximately 200 μm to approximately 800 μm, however it should be appreciated that these are nominal values and the values could be thinner or thicker depending on the application. The window lid 104 is formed from a material that is transparent in the wavelength of interest such as, for example, silicon in the infrared wavelengths of 8-12 microns and is coupled to the substrate 102 via a dual seal ring assembly which is discussed in greater detail below.

The dual seal ring assembly creates a hermetic seal that protects the regions between the dual seal ring assembly, the window lid 104, and the substrate 102 from the external environment surrounding the MEMS package 100 and enables a vacuum environment within the cavity region 108 of the 100. According to a non-limiting embodiment, the window lid 104 includes an inner lip 106 that extends from the ends of the inner surface of the window lid 104. The inner lip 106 is sealed against the dual seal ring assembly such that a cavity region 108 and a seal gap 110 are formed between the substrate 102 and the window lid 104. Due to the hermetic seal created by the dual seal ring assembly, the cavity region 108 and the seal gap 110 are protected from the environment surrounding the MEMS package 100. A vacuum can be established in cavity 108 and seal gap 110. According to a non-limiting embodiment, the vacuum can be used to thermally isolate one or more MEMS devices that require isolation from their environment in order to improve their performance as discussed in greater detail below. According to another non-limiting embodiment, the cavity 108 and the seal gap 110 can be backfilled with a gas to provide a known background to mitigate shock and dampening. In this manner, the MEMS package 100 can be constructed as an accelerometer, for example.

The cavity region 108 has a height ranging, for example, from about 200 micrometers (μm) to about 400 μm. The seal gap 110, however, has a height ranging, for example, from about 2 μm to about 12 μm. It should be appreciated, however, that the height of the seal gap 100 is not limited thereto so long there is no physical contact between the window lid 104 and the VRP group 114. Further, the portion of the window lid 104 located above the cavity 108 may have a thickness ranging, for example, from approximately 100 μm to approximately 1000 μm depending on the application and design intent.

The MEMS package 100 further includes one or more MEMS devices. For example, the MEMS package 100 includes a pixel array 112 and a VRP group 114. The pixel array 112 includes a plurality of sensors such as infrared radiation sensors, for example, formed on an upper surface of the substrate 102 located in the cavity region 108. The sensor can be configured as microbolometer such that the MEMS can be constructed as a microbolometer package. Accordingly, the pixel array 112 is interposed between the inner surface of the window lid 104 and the substrate 102. The VRP group 114 is formed on a second portion of the substrate 102 located in the seal gap 110. Accordingly, the VRP group 114 is interposed between the inner lip 106 and the substrate 102. Each sensor included in the pixel array 112 is configured to detect infrared radiation, e.g., wavelengths between about 7.5 μm and about 14 μm, for example. In response to the infrared radiation, the electrical resistance of the microbolometer changes. This resistance change is measured and processed into temperatures which can be used to create an image as understood by one of ordinary skill in the art. The VRP group 114 also includes one or more microbolometers. Unlike the pixel array 112, however, the microbolometers of the VRP group 114 are shielded from receiving infrared radiation via a VRP shield 116, for example. The VRP shield 116 can be formed from any material that blocks radiation from reaching the VRP group 114. In this manner, the VRP group 114 is used as a reference to distinguish infrared radiation received at the pixel array 112 from general noise existing in the pixel environment.

As further illustrated in FIGS. 3A-3B, the dual seal ring assembly according to a non-limiting embodiment includes an inner seal ring 118a and an outer seal ring 118b. Each of the inner seal ring 118a and the outer seal ring 118b extends between the substrate 102 and the window lid 104 to define a height of approximately 7 μm (but could be much small at 2 microns and larger at 12 microns) and each extends along a length of the substrate 102 to define a seal length ranging from approximately 200 μm to approximately 250 μm. It should be appreciated, however, that each seal ring 118a/118b can be larger or smaller in width depending on the geometry of the MEMS package 100. Each of the inner seal ring 118a and the outer seal ring 118b are formed from a hermetic seal material that creates an airtight seal that protects the cavity region 108 and the seal gap 110 from the exterior environment. The hermetic material includes various materials including, but not limited to, AuSn solder and its alloys, Indium solder and its alloys, SnPb and its alloys titanium (Ti), a fusible metal alloy material such as a Ti-based solder material, or a glass frit material, for example.

According to a non-limiting embodiment, the inner seal ring 118a and the outer seal ring 118b are formed at particular locations on the substrate 102 to define the desired boundary conditions of the MEMS package 100. For example, the inner seal ring 118a may be formed as close as possible to the VRP group 114, while the outer seal ring 118b is formed from as close as possible to the outer edge of the inner lip 106. Accordingly, a seal void 120 is formed between the inner seal ring 118a and the outer seal ring 118b. The distance between the inner seal ring 118a and the outer seal ring 118b can vary according to the particular dimensions of the MEMS package 100. However, at least one embodiment includes a seal void 120 having a distance of approximately 250 μm that separates the inner seal ring 118a from the outer seal ring 118b. In this manner, a hermetic seal is created that forms the vacuum seal and protects the cavity region 108 and seal gap 110 from the external environment, while the outer seal ring 118b anchors the inner lip 106 to the substrate 102. Accordingly, the outer edge of the inner lip 106 is prevented from pivoting about the inner seal ring 118a, thereby reducing deflection of the window lid 104. In other words, the outer seal ring 118b reduces window deflection, thereby preventing the window lid 104 from contacting the VRP group 114.

As described in detail above, at least one non-limiting embodiment described above provides a MEMS package 100 including a dual seal ring assembly having an inner seal ring 118a spaced apart from an outer seal ring 118b. The outer seal ring 118b anchors the window lid 104 to the substrate 102, thereby reducing deflection of the window lid 104. Referring to FIG. 4, for example, a table showing test results of various dual seal ring assembly designs compared to a single seal ring assembly design are shown. It can be appreciated from the results that the dual seal ring assembly design allows a window lid deflection of approximately 0.87 μm compared to a single seal ring assembly design that allows for a window lid deflection of approximately 1.69 μm. In other words, the dual seal ring assembly reduces the window lid deflection by almost half. Moreover, the implementation of an inner seal ring 118a and an outer seal ring 118b greatly reduces the window lid stress applied to the seal ring assembly. For example, a conventional microbolometer package having only a single, narrow seal ring realizes a window lid stress of approximately 17,010 pounds per square inch (PSI). However, implementing a dual seal ring assembly into the same microbolometer package reduces the window lid pressure applied to the seal ring assembly to approximately 4,264 PSI. Accordingly, the dual seal ring assembly reduces the window lid stress by approximately four times. Therefore, since the dual seal ring assembly reduces the window deflection and the overall stress applied to the seal assembly itself, the MEMS package 100, according to at least one embodiment of the disclosure, can be designed with a larger cavity region 108 while using a thinner window lid 104 as compared to convention microbolometer packages.

Figure 5B:
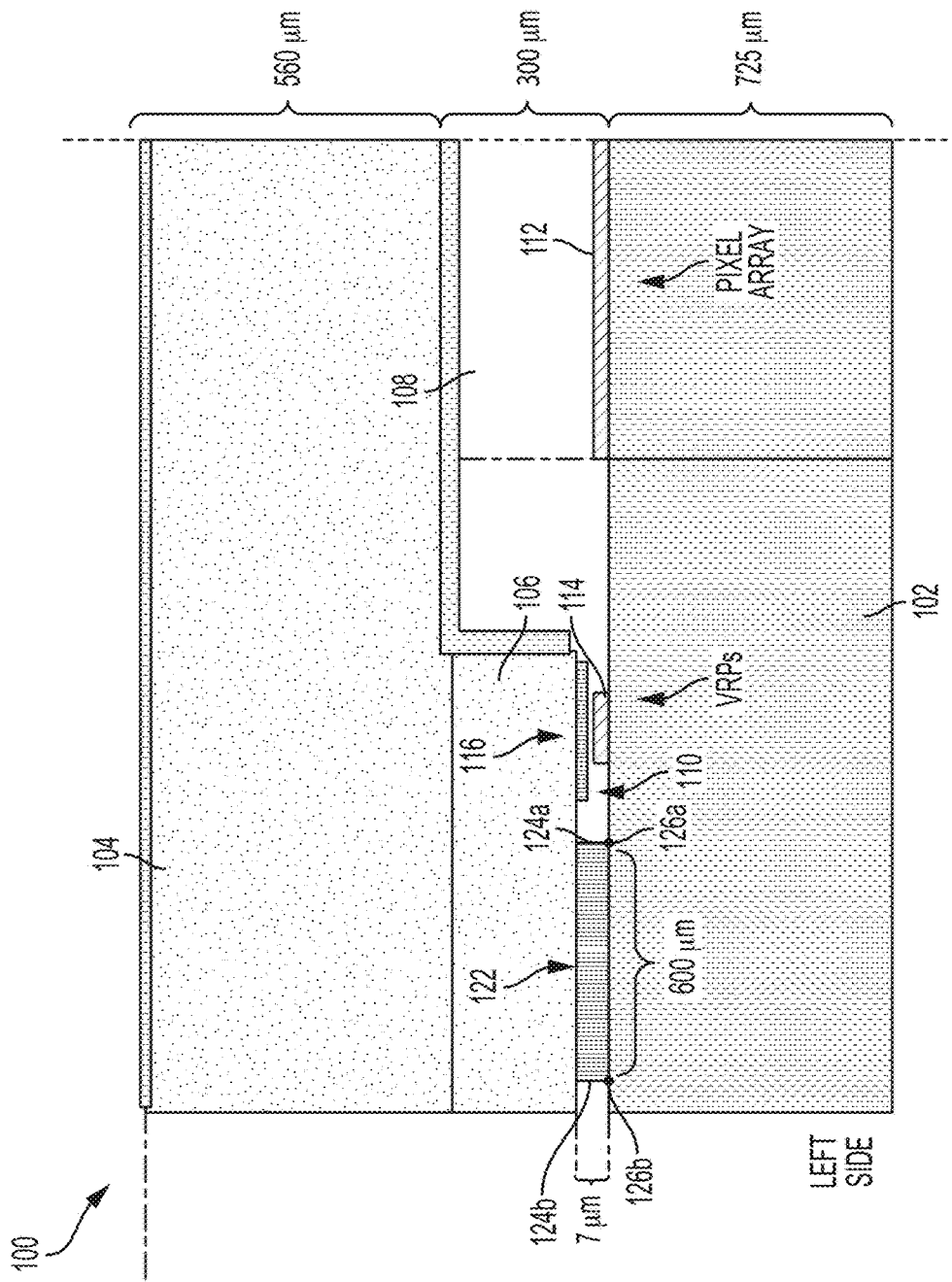

Referring now to FIGS. 5A-5B, a MEMS package 100 is illustrated according to another non-limiting embodiment. The microbolometer package 100 illustrated in FIGS. 5A-5B replaces the dual seal ring assembly including the inner seal ring 118a and outer seal ring 118b with a wide seal ring assembly 122. The wide seal ring assembly 122 includes an inner edge 124a and an outer edge 124b. The inner edge 124a couples the window lid 104 to the substrate 102 at an inner boundary point 126a. The outer edge 124b couples the window lid 104 to the substrate 102 at an outer boundary point 126b. In this manner, the width of the wide seal ring 122 can be sized such that the inner edge 124a and outer edge 124b define the desired boundary conditions of the MEMS package 100. Accordingly, the outer edge 124b prevents the wide seal ring assembly 122 from pivoting about the inner boundary point 126a such that the deflection of the window lid 104 is reduced. As a result, the size of the cavity region 108 can be increased while the thickness of the window lid 104 can be reduced to provide a MEMS package 100 having greater precision than conventional microbolometer packages.

Figure 6A:
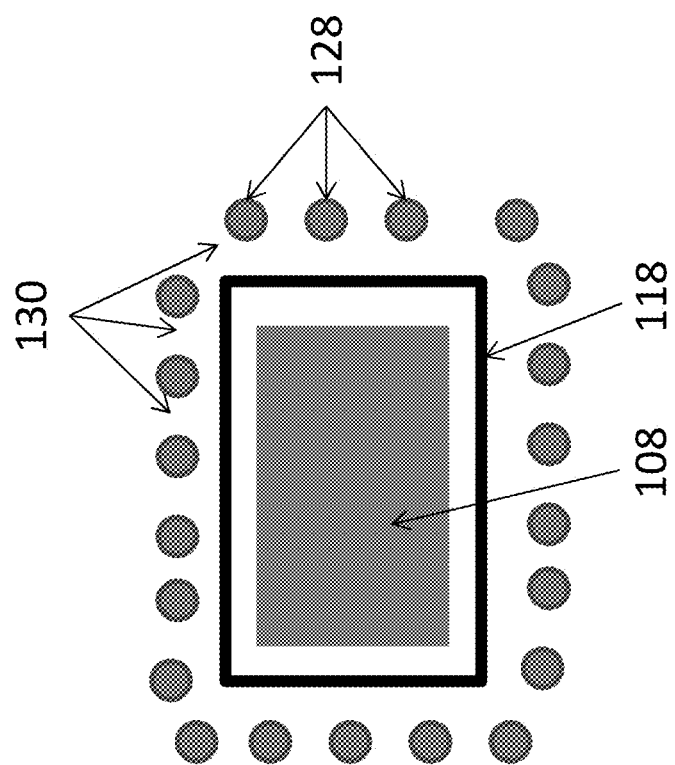
FIGS. 6A-6B illustrate a top view of a microbolometer package including a dual seal assembly with a non-continuous seal ring and a continuous seal ring according to another non-limiting embodiment.
Figure 6B:
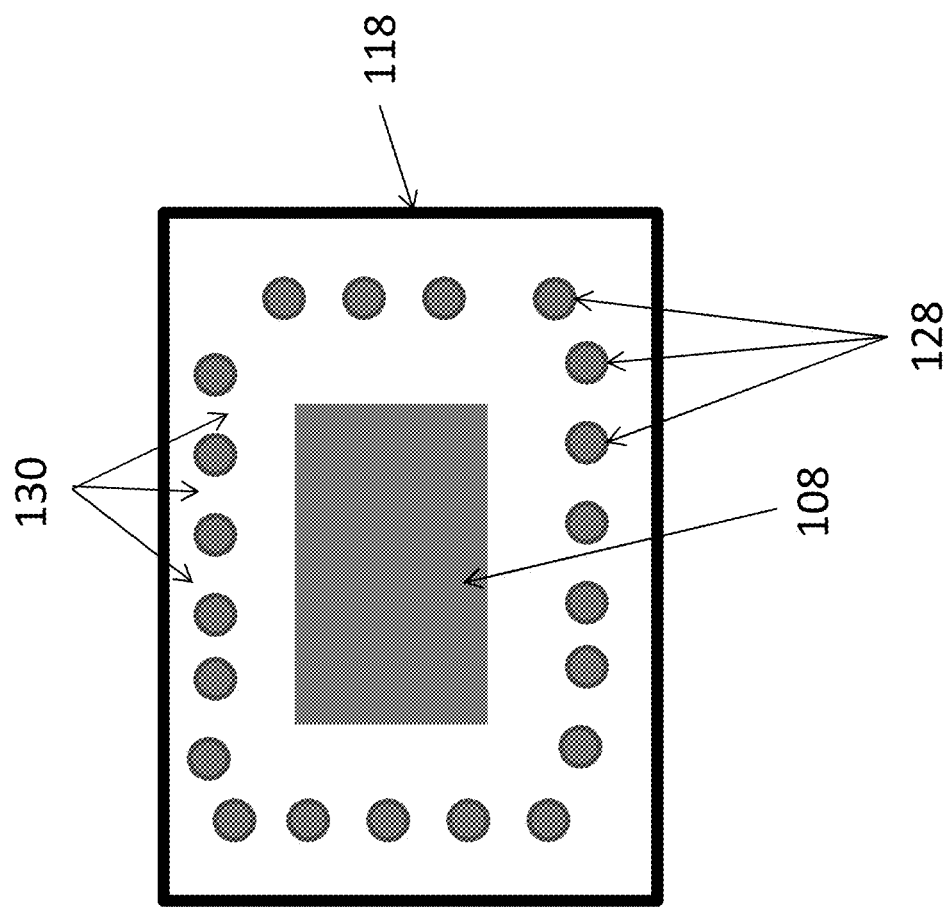

Referring now to FIGS. 6A and 6B, a top view of a dual seal ring assembly 122 is illustrated according to another non-limiting embodiment. The dual seal ring assembly 122 includes a continuous seal ring 118 and a non-continuous seal ring 128. The continuous seal ring 118 can be interposed between the non-continuous seal ring 128 and the cavity (see FIG. 6A). Alternatively, the non-continuous seal ring 128 can be interposed between the continuous seal ring 118 and the cavity 108. The continuous seal ring 118 is configured to form a hermetic seal, while the non-continuous seal ring 128 is formed of discrete elements having breaks or voids 130 therebetween. In this manner, the non-continuous seal ring 128 allows solder to be conserved while still providing support. Although only two seal rings are illustrated, it is appreciated that more than two-seal rings can exist, so long as at least one seal ring is configured as a continuous seal ring 118 to provide the hermetic seal.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of reducing deflection of a window lid included in a MEMS package, the method comprising:
    forming a seal ring assembly including an inner seal ring on an upper surface of a substrate to create a first boundary point adjacent at least one MEMS device formed on the upper surface, and an outer seal ring on the upper surface of the substrate and spaced apart from the inner seal ring to define a seal void therebetween and to create a second boundary point adjacent at least one of outer edge of the substrate, a width of the seal void being greater than each of a width of the inner seal ring and a width of the outer seal ring;
    extending a portion of the seal ring assembly completely along an outer perimeter of the substrate;
    forming a window lid on the seal ring assembly to define a seal gap containing the at least one MEMS device such that a hermetic seal is formed using the seal ring assembly to protect the seal gap from an external environment surrounding the at least one MEMS device; and
    anchoring the window lid to the substrate via at least the second boundary point such that the deflection of the window lid into the seal gap is reduced.

2. The method of claim 1, further comprising forming at least one window edge directly on the outer seal ring to inhibit the window lid from pivoting about the inner seal ring.

3. The method of claim 1, further comprising forming each of the inner seal ring and the outer seal ring from a sealing material to create the hermetic seal.

4. A microelectromechanical systems (MEMS) package, comprising:
    a substrate extending between a first pair of outer edges to define a length and a second pair of outer edges to define a width;
    a seal ring assembly on the substrate, the seal ring assembly including an inner seal ring that creates a first boundary point adjacent to at least one MEMS device and an outer seal ring that creates a second boundary point adjacent at least one of the outer edges, the inner seal ring being spaced apart from the outer seal ring to define a seal void therebetween; and
    a window lid on the seal ring assembly to define a seal gap containing the at least one MEMS device, the seal ring assembly creating a hermetic seal that protects the seal gap from an external environment surrounding the at least one MEMS device,
    wherein a portion of the seal ring assembly extends completely along an outer perimeter of the substrate, and the seal ring assembly anchors the window lid to the substrate at the second boundary point such that deflection of the window lid into the seal gap is reduced, and
    wherein a width of the seal void is greater than each of a width of the inner seal ring and a width of the outer seal ring.

* * * * *